(12) United States Patent
Sung et al.

(10) Patent No.: US 8,343,872 B2
(45) Date of Patent: Jan. 1, 2013

(54) METHOD OF FORMING STRAINED STRUCTURES WITH COMPOUND PROFILES IN SEMICONDUCTOR DEVICES

(75) Inventors: Hsueh-Chang Sung, Zhubei (TW); Hsien-Hsin Lin, Hsin-Chu (TW); Kuan-Yu Chen, Taipei County (TW); Chien-Chang Su, Kaohsiung (TW); Tsz-Mei Kwok, Hsinchu (TW); Yi-Fang Pai, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 265 days.

(21) Appl. No.: 12/613,714

(22) Filed: Nov. 6, 2009

(65) Prior Publication Data

US 2011/0108894 A1      May 12, 2011

(51) Int. Cl.
*H01L 21/336* (2006.01)

(52) U.S. Cl. ........ 438/691; 438/289; 438/294; 438/197; 438/938; 438/40; 257/288; 257/E21.431; 257/E29.193; 257/419; 257/18

(58) Field of Classification Search ............... 438/691, 438/938, 40; 257/18, E29.193, 419
See application file for complete search history.

(56) References Cited

U.S. PATENT DOCUMENTS

| | | | |
|---|---|---|---|
| 7,045,407 B2 | 5/2006 | Keating et al. | |
| 7,851,313 B1 * | 12/2010 | Luo et al. | 438/285 |
| 2007/0287272 A1 * | 12/2007 | Bauer et al. | 438/485 |
| 2008/0067557 A1 * | 3/2008 | Yu et al. | 257/255 |
| 2008/0237742 A1 * | 10/2008 | Ranade et al. | 257/401 |

* cited by examiner

*Primary Examiner* — Marcos D. Pizarro
*Assistant Examiner* — Eva Yan Montalvo
(74) *Attorney, Agent, or Firm* — Haynes and Boone, LLP

(57) ABSTRACT

The present disclosure provides a method of fabricating that includes providing a semiconductor substrate; forming a gate structure on the substrate; performing an implantation process to form a doped region in the substrate; forming spacers on sidewalls of the gate structure; performing an first etching to form a recess in the substrate, where the first etching removes a portion of the doped region; performing a second etching to expand the recess in the substrate, where the second etching includes an etchant and a catalyst that enhances an etching rate at a remaining portion of the doped region; and filling the recess with a semiconductor material.

13 Claims, 3 Drawing Sheets

METHOD OF FORMING STRAINED STRUCTURES WITH COMPOUND PROFILES IN SEMICONDUCTOR DEVICES

BACKGROUND

When a semiconductor device such as a metal-oxide-semiconductor field-effect transistors (MOSFETs) is scaled down through various technology nodes, high k dielectric material and metal are adopted to form a gate stack. In addition, strained structures utilizing epitaxy silicon germanium (SiGe) may be used to enhance carrier mobility. However, current techniques to form these strained structures have not been satisfactory in all respects. For example, these strained structures may not produce sufficient stress in a channel region to improve a saturation drain current of the device.

SUMMARY

One of the broader forms of an embodiment of the present invention involves a semiconductor device. The semiconductor device includes a semiconductor substrate; a gate structure disposed over a channel region of the substrate; and strained structures disposed in the substrate at either side of the gate structure and formed of a semiconductor material different from the semiconductor substrate, each strained structure having a profile that includes a first portion proximate the channel region and a second portion that tapers from the first portion at an angle ranging from about 45 to about 65 degrees, the angle being measured with respect to an axis parallel to a surface of the substrate.

Another one of the broader forms of an embodiment of the present invention involves a method of fabricating a semiconductor device. The method includes providing a semiconductor substrate; forming a gate structure on the substrate; performing an implantation process to form a doped region in the substrate; forming spacers on sidewalls of the gate structure; performing an first etching to form a recess in the substrate, wherein the first etching removes a portion of the doped region; performing a second etching to expand the recess in the substrate, wherein the second etching includes an etchant and a catalyst that enhances an etching rate at a remaining portion of the doped region; and filling the recess with a semiconductor material.

Yet another one of the broader forms of an embodiment of the present invention involves a method of fabricating semiconductor device. The method includes providing a semiconductor substrate; forming a gate structure on a surface of the substrate; performing an implantation process to form a doped region in the substrate; forming spacers on sidewalls of the gate structure; performing an anisotropic etching to form a recess in the substrate; performing a thermal etching to modify the recess in the substrate, the thermal etching utilizing an etchant and a catalyst that enhances an etching rate at the doped region; and filling the recess with a semiconductor material different from the semiconductor substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
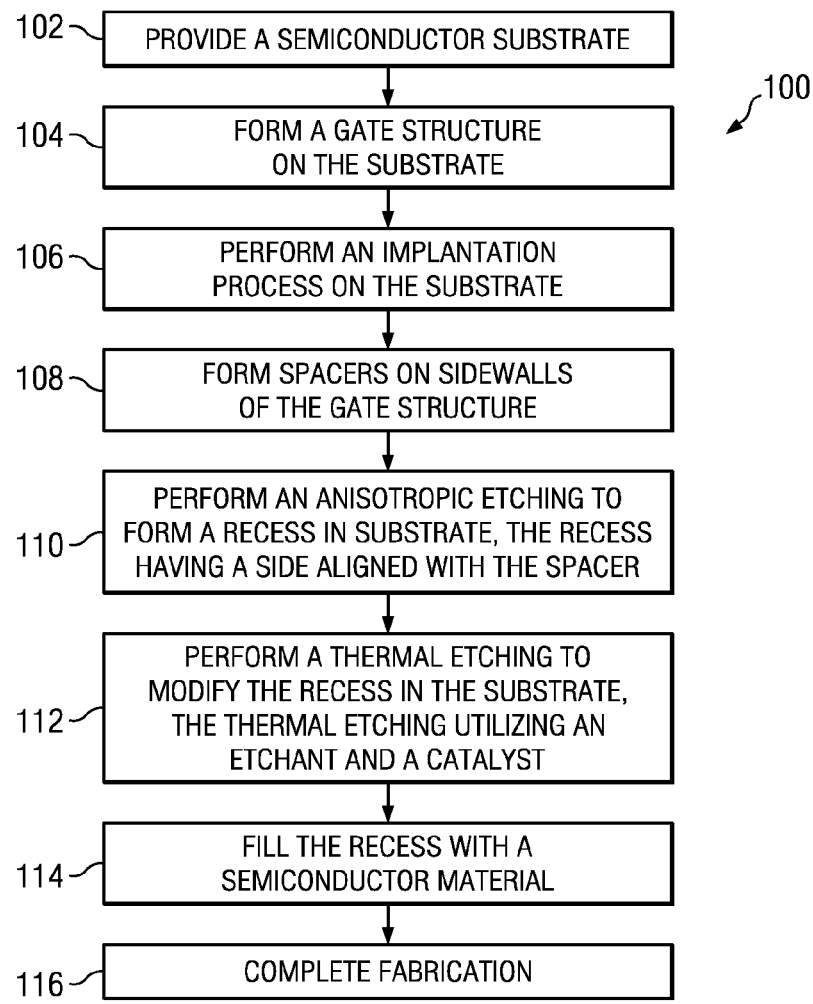
FIG. 1 is a flow chart of a method of fabricating a semiconductor device having strained features according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a flow chart of a method 100 of fabricating a semiconductor device according to various aspects of the present disclosure. The method 100 begins with block 102 in which a semiconductor substrate is provided. The method 100 continues with block 104 in which a gate structure is formed on the substrate. The method 100 continues with block 106 in which an implantation process is performed on the substrate. The method continues with block 108 in which spacers are formed on sidewalls of the gate structure. The method 100 continues with block 110 in which an anisotropic etching is performed to form a recess in the substrate, the recess having a side aligned with the spacer. The method 100 continues with block 112 in which a thermal etching is performed to modify the recess in the substrate. The thermal etching utilizes an etchant and a catalyst. The method 100 continues with block 114 in which the recess is filled with a semiconductor material. The method 100 continues with block 116 in which fabrication of the semiconductor device is completed. The discussion that follows illustrates various embodiments of a semiconductor device that can be fabricated according to the method 100 of FIG. 1.

Figure 2A:
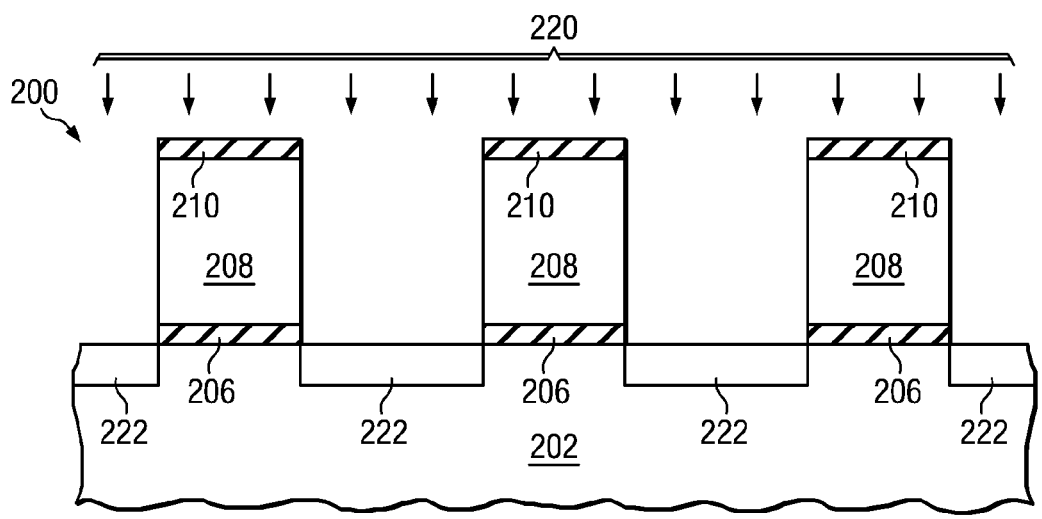
FIGS. 2A-2E are cross-sectional views of an embodiment of a semiconductor device at various stages of fabrication according to the method of FIG. 1.

Referring to FIGS. 2A-2E, illustrated is an embodiment of a semiconductor device 200 at various stages of fabrication according to the method 100 of FIG. 1. It is understood that FIGS. 2A-2E have been simplified for the sake of clarity to better understand the inventive concepts of the present disclosure. In FIG. 2A, the semiconductor device 200 includes a substrate 202. The substrate 202 includes a silicon substrate. In another embodiment, the semiconductor substrate 202 may include an epitaxial layer. For example, the substrate 202 may have an epitaxial layer overlying a bulk semiconductor. The substrate 202 further includes doped regions such as p-wells and n-wells. Furthermore, the substrate 202 may include a semiconductor-on-insulator (SOI) structure such as a buried dielectric layer. Alternatively, the substrate 202 may include a buried dielectric layer such as a buried oxide (BOX) layer, such as that formed by a method referred to as separation by implantation of oxygen (SIMOX) technology, wafer bonding, selective epitaxial growth (SEG), or other proper method. The semiconductor device 200 includes active regions defined in the substrate 202.

Various shallow trench isolation (STI) structures (not shown) are formed in the semiconductor substrate for isolating the various active regions. The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

One or more operational devices are formed in the active regions. The operational devices include n-type and p-type metal-oxide-semiconductor (NMOS and PMOS) field-effect transistors. The operational devices are configured as an array of NMOS devices and an array of PMOS devices. The NMOS and PMOS devices may be fabricated by CMOS technology processing. Accordingly, it is understood that additional processes may be provided before, during, and after the method 100 of FIG. 1, and that some other processes may only be briefly described herein. Each NMOS and PMOS device includes a gate structure formed on the semiconductor substrate 202. In the present embodiment, only PMOS devices are illustrated for the sake of clarity. It is understood that the NMOS devices in other regions of the substrate 202 may be protected by a photoresist or other suitable protection layer during formation of the strained features in the PMOS devices.

The gate structure includes a gate dielectric 206 and a gate electrode 208. The gate dielectric 206 may include silicon oxide, silicon nitride, high-k dielectric, or other suitable material. The high-k dielectric layer may include a binary or ternary high-k film such as HfOx. Alternatively, the high-k dielectric layer may optionally include other high-k dielectrics such as LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides, or other suitable materials. The gate dielectric is formed by a suitable process such as an atomic layer deposition (ALD), chemical vapor deposition (CVD), physical vapor deposition (PVD), thermal oxidation, UV-ozone oxidation, or combinations thereof.

The gate electrode 208 may include polysilicon (or poly). For example, silane (SiH$_4$) may be used as a chemical gas in a CVD process to form the poly. The poly layer may include a thickness ranging from about 400 to about 800 angstrom (A). The gate structure may further include a hard mask layer 210 formed on the gate electrode 208. The hard mask layer 210 includes silicon oxide. Alternatively, the hard mask layer 210 may optionally include silicon nitride, silicon oxynitride, and/or other suitable dielectric materials, and may be formed using a method such as CVD or PVD. The hard mask layer 210 may include a thickness ranging from about 100 to about 400 angstrom (A). The gate structure may further include a seal layer disposed on sidewalls of the gate structure for sealing and protecting the gate structure.

An implantation process 220 is performed to implant dopants into the substrate 202. The implantation process 220 may utilize n-type dopants such as As or P for a pocket implant process, or may utilize p-type dopants such as B or BF2 for a lightly doped drain (LDD) implant process. The pocket implant process may utilize an energy ranging from 20 KeV to about 80 KeV, a dosage ranging from about 1E12 atoms/cm$^2$ to about 1E14 atoms/cm$^2$, and a tilt angle ranging from about 15° to about 45°. The LDD implant process may utilize an energy ranging from about 0.5 KeV to about 5 KeV, a dosage ranging from about 1E14 atoms/cm$^2$ to about 1E16 atoms/cm$^2$, and a tilt angle ranging from about 0 to about 30°. Accordingly, lightly doped source/drain (LDD) regions 222 are formed in the substrate 202. The LDD regions 222 are aligned with sidewalls of the gate structure.

Figure 2B:
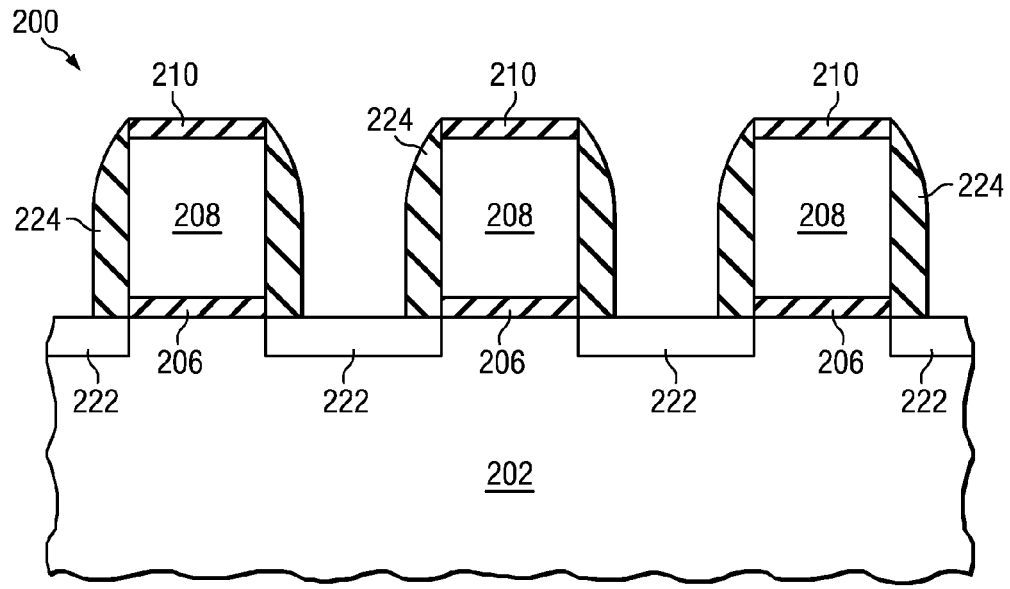

In FIG. 2B, spacers 224 are formed on the sidewalls of the gate structure. The spacers 224 may be formed by forming a dielectric layer over the substrate 202 and the gate structure, and performing a dry etching (e.g., anisotropic etching) to form the spacers 224. The spacers 224 may include silicon nitride or silicon carbon nitride. The dielectric layer may be formed by CVD, PVD, or furnace-type processing. The spacers 224 have a thickness ranging from about 10 nm to about 20 nm.

Figure 2C:
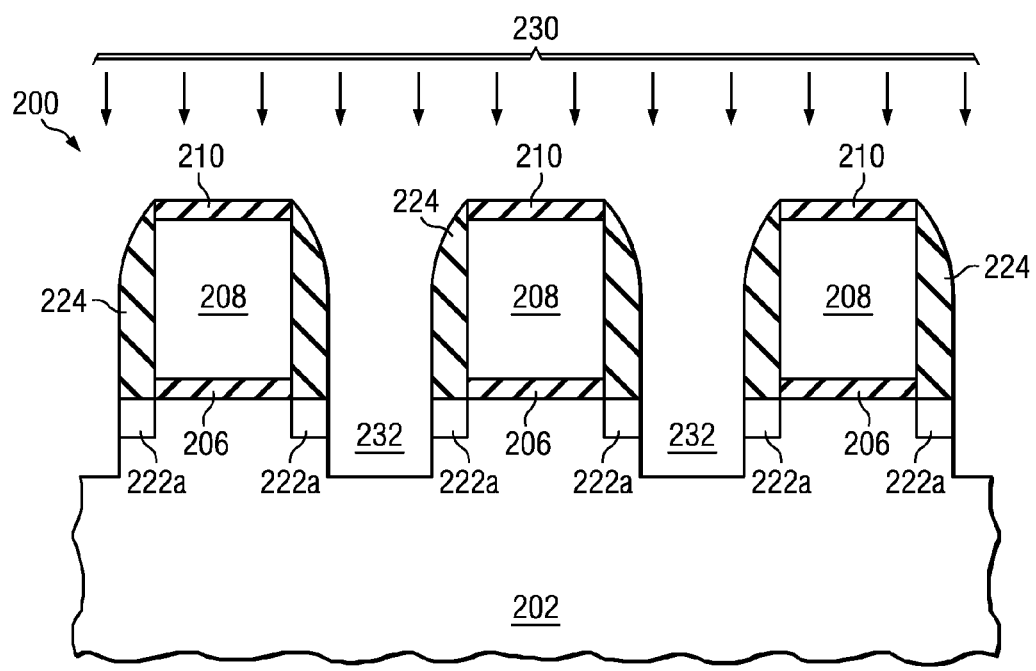

In FIG. 2C, an etching process 230 is performed to etch a recess or opening 232 in the substrate 202. The etching process 230 includes a dry etching process (e.g., anisotropic etching) that utilizes a combination of HBr/O2/He, a pressure ranging from about 1 mT to about 1000 mT, a power ranging from about 50 W to about 1000 W, a bias voltage ranging from about 100 V to about 500 V, an HBr flow rate ranging from about 10 sccm to about 500 sccm, an O2 flow rate ranging from about 0 sccm to about 100 sccm, and an He flow rate ranging from about 0 sccm to about 1000 sccm. The dry etching removes portions of the silicon substrate 202 that are unprotected or exposed. The dry etching process allows better control of an etching direction to achieve of a particular shape. Accordingly, the recess 232 has vertical sidewalls that are aligned with the spacer 224 due to the directional/anisotropic etching. The recess 232 may have a depth ranging from about 300 Angstrom to about 600 Angstrom. It is noted that a portion of the LDD region 222a remains after the etching process 230. The remaining LDD region 222a was protected by the spacer 224 during the etching process 230.

Figure 2D:
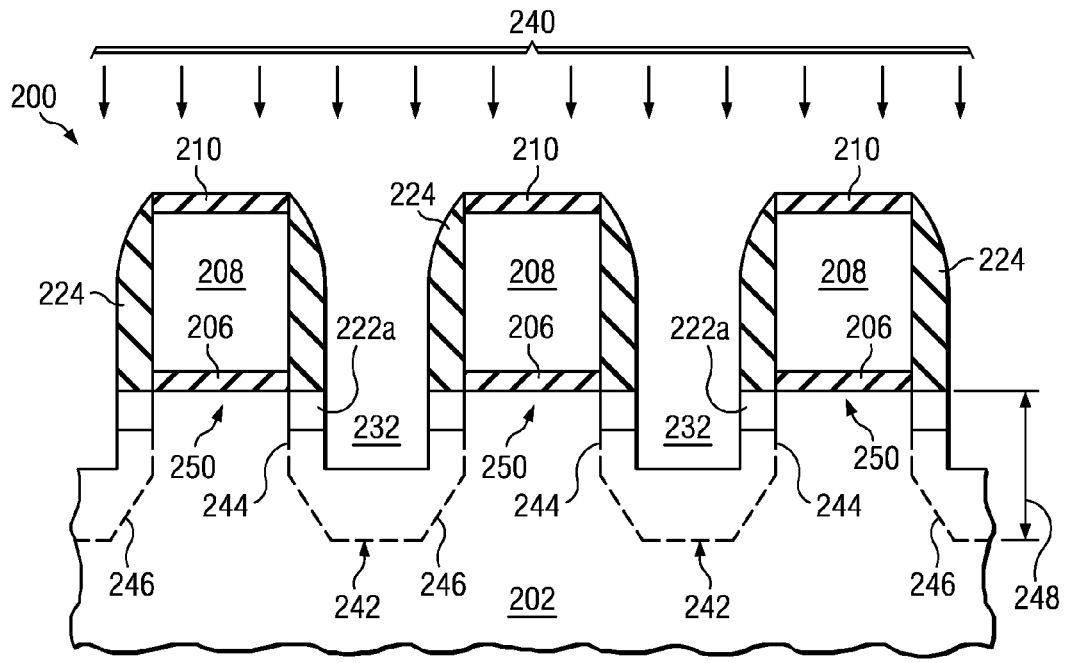
Figure 2E:
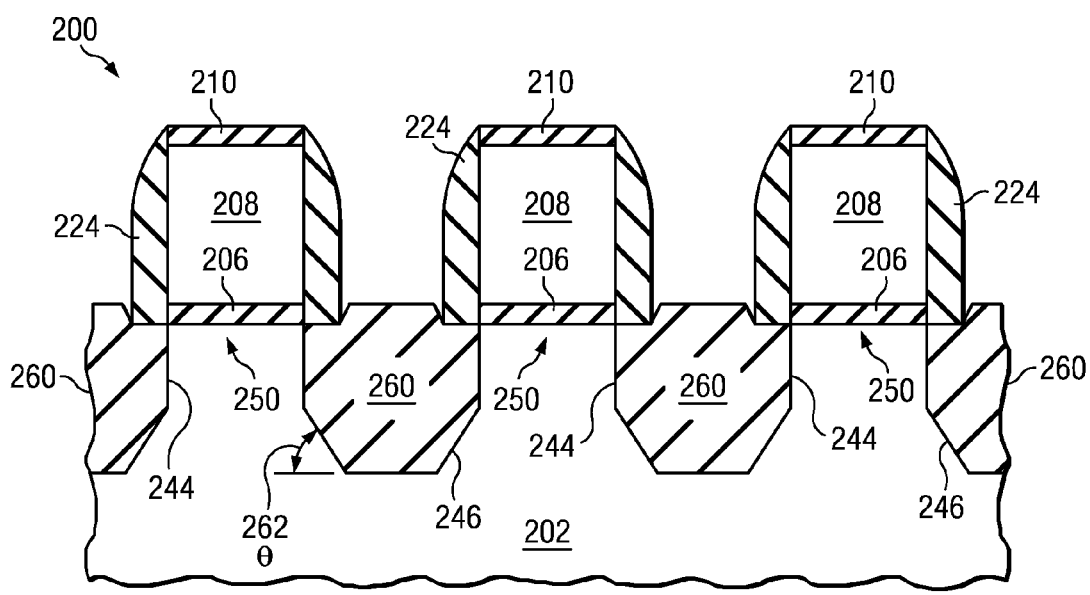

In FIG. 2D, an etching process 240 is performed to expand the recess 232 in the substrate 202. The etching process 240 includes a thermal etching process that utilizes an etchant, a catalyst, and a carrier gas. In the present embodiment, the thermal etching process utilizes HCl as the etchant gas, GeH4 as the catalyst, and H2 or N2 as the carrier gas. The HCl has a flow rate ranging from about 50 sccm to about 500 sccm, the GeH4 has a flow rate ranging from about 10 to about 500 sccm, and the H2 or N2 has a flow rate ranging from about 5 slm to about 40 slm. The thermal etching process is performed at a temperature ranging from 550° C. to about 800° C. and a pressure ranging from about 5 Torr to about 300 Torr. The thermal etching process exhibits an etching profile that is illustrated by the dashed lines 242. It has been observed that an etching rate of the HCl gas with respect to the remaining LDD region 222a of the substrate 202 is very low as compared to other regions of the substrate 202. The GeH4 catalyst is utilized to enhance the etching rate of the substrate 202 at the remaining LDD region 222a. Accordingly, the remaining LDD region 222a is removed thereby expanding the recess 242 with a portion 244 that is in close proximity to a channel region 250 of the PMOS devices. In some embodiments, the portion 244 may be substantially vertical (e.g., 90 degrees with respect to an axis parallel to the surface of the substrate) as shown in FIG. 2E. In some other embodiments, the portion 244 may be sloped (e.g., between about 60 degrees and less than 90 degrees with respect to an axis parallel to the surface of the substrate). It should be note that the thermal etching is controlled so that the channel region 250 of the substrate 202 is not etched. Additionally, the thermal etching process may be tuned so that there is a tapered etching in a direction away from the surface of the substrate 202. As such, the recess 242 may include a tapered portion 246 that extends from the portion 244. Further, the recess 242 includes an overall depth 248 of about 400 to about 800 Angstrom.

In FIG. 2E, an epitaxy process is performed to deposit a semiconductor material in the recess 242. The semiconductor material is different from the substrate 202. Accordingly, the channel region 250 is strained or stressed to enable carrier mobility of the device and enhance the device performance. A pre-cleaning process may be performed to clean the recess 242 with HF or other suitable solution. In the present embodiment, silicon germanium (SiGe) 260 is deposited by an epitaxy (epi) process on the substrate 202 to form the strained source and drain regions of the PMOS devices. As noted above, the SiGe 260 has a tapered portion 246 that extends from the portion 244. The tapered portion 246 is tapered at an angle θ ranging from about 45 to about 65 degrees. The angle θ is measured with respect to an axis 262 parallel to the surface of the substrate 202. Additionally, the SiGe 260 is deposited such that it is raised a distance of about 250 Angstrom above the surface of the substrate 202. In furtherance of the present embodiment, the SiGe 260 may be in-situ doped with p-type impurities, such as B or In, to form source/drain regions of the PMOS devices.

It has been observed that formation of the SiGe 260 structure with a profile that is in close proximity to the channel region 250 near the surface of the substrate 202 provides more stress and strain, and thus carrier mobility is enhanced. Accordingly, a saturation drain current of the PMOS devices is improved over current techniques that form the strained structures. Further, the etching processes discussed above allow for a better process margin to control the proximity of the SiGe 260 structure from the channel region 250. Moreover, the SiGe 260 structure may not suffer from a short channel penalty such as drain induced barrier lowering (DIBL) due to pull back of the tapered portion at the lower region of the SiGe 260 structure. This is even so even as device features shrink and the channel length becomes smaller in advanced technology process nodes (e.g., 32 nm and below).

The semiconductor device 200 continues with processing to complete fabrication as discussed briefly below. In some embodiments, the spacers 224 remain on the sidewalls of the gate structure and processing continues with forming silicide features on the raised source/drain regions to reduce the contact resistance. The silicide can be formed on the sources/drains regions by a process including depositing a metal layer, annealing the metal layer such that the metal layer is able to react with silicon to form silicide, and then removing the non-reacted metal layer. In some other embodiments, the spacers 224 may function as dummy spacers and may be removed, and processing continues with forming lightly doped source/drain (LDD) regions and heavily doped source/drain regions in the SiGe 260 structure.

Further, an inter-level dielectric (ILD) layer is formed on the substrate and a chemical mechanical polishing (CMP) process is further applied to the substrate to polish the substrate. In another example, an contact etch stop layer (CESL) is formed on top of the gate structures before forming the ILD layer. In an embodiment, the gate electrode 208 remains poly in the final device. In another embodiment, the poly gate is removed and replaced with a metal in a gate last or gate replacement process. In a gate last process, the CMP process on the ILD layer is continued until the polysilicon surface is exposed, and an etching process is performed to remove the poly thereby forming trenches. The trenches are filled with a proper work function metal (e.g., p-type work function metal and n-type work function metal) in the PMOS devices and the NMOS device. A multilayer interconnection (MLI) is formed on the substrate to electrically connect various device features to form a integrated circuit. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form a copper multilayer interconnection structure.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
   providing a semiconductor substrate;
   forming a gate structure on the substrate;
   performing an implantation process to form a doped region in the substrate;
   forming spacers on sidewalls of the gate structure;
   performing a first etching to form a recess in the substrate, wherein the first etching removes a portion of the doped region;
   performing a second etching to expand the recess in the substrate, wherein the second etching includes an etchant and a catalyst that enhances an etching rate at a remaining portion of the doped region and results in a profile of the recess that includes two adjacent sidewalls, the two adjacent sidewalls including a first sidewall and a second sidewall and having different angles as measured with respect to an axis parallel to a surface of the substrate, neither of the two adjacent sidewalls being parallel to the axis, the first sidewall being closer to the surface of the substrate and having an angle that does not exceed 90 degrees as measured with respect to the axis; and
   filling the recess with a semiconductor material.

2. The method of claim 1, wherein the second etching includes a thermal etching that utilizes an etchant gas of HCl and a catalyst gas of GeH4.

3. The method of claim 2, wherein a flow rate of HCl ranges from about 50 to about 500 sccm, and a flow rate of GeH4 ranges from about 10 to about 500 sccm.

4. The method of claim 2, wherein the thermal etching further utilizes a carrier gas, the carrier gas being one of H2 and N2.

5. The method of claim 1, wherein the thermal etching utilizes a temperature ranging from about 550 to about 800° C. and a pressure ranging from about 5 to about 300 Torr.

6. The method of claim 1, wherein the first etching includes an anisotropic etching that forms the recess with a vertical side aligned with one of the spacers.

7. The method of claim 1, wherein the filling the recess with the semiconductor material includes depositing silicon germanium (SiGe) by an epitaxy process.

8. A method of fabricating a semiconductor device, comprising:
  providing a semiconductor substrate;
  forming a gate structure on a surface of the substrate;
  performing an implantation process to form a doped region in the substrate;
  forming spacers on sidewalls of the gate structure;
  performing an anisotropic etching to form a recess in the substrate;
  performing a thermal etching to modify the recess in the substrate, the thermal etching utilizing an etchant and a catalyst that enhances an etching rate at the doped region and resulting in a profile of the recess that includes two adjacent sidewalls, the two adjacent sidewalls including a first sidewall and a second sidewall and having different angles as measured with respect to an axis parallel to the surface of the substrate, neither of the two adjacent sidewalls being parallel to the axis, the first sidewall being closer to the surface of the substrate and having an angle that does not exceed 90 degrees as measured with respect to the axis; and
  filling the recess with a semiconductor material different from the semiconductor substrate.

9. The method of claim 8, wherein the thermal etching utilizes an etchant gas of HCl and a catalyst gas of GeH4.

10. The method of claim 9, wherein the thermal etching utilizes a temperature ranging from about 550 to about 800° C. and a pressure ranging from about 5 to about 300 Torr.

11. The method of claim 8, wherein the modified recess has a depth ranging from about 400 to about 800 Angstrom, the depth being measured from the surface of the substrate.

12. The method of claim 8, wherein the first sidewall is proximate a channel region and the second sidewall tapers from the first sidewall at an angle ranging from about 45 to about 65 degrees, the angle being measured with respect to the axis parallel to the surface of the substrate.

13. The method of claim 12, wherein the angle of the first sidewall ranges from about 60 to about 90 degrees, the angle of the first sidewall being measured with respect to the axis parallel to the surface of the substrate.

* * * * *